(12) United States Patent
Akita et al.

(10) Patent No.: US 10,749,643 B2
(45) Date of Patent: Aug. 18, 2020

(54) WAVEFORM OBSERVATION SYSTEM AND METHOD FOR WAVEFORM OBSERVATION

(71) Applicant: DENSO CORPORATION, Kariya, Aichi-pref. (JP)

(72) Inventors: Hironobu Akita, Kariya (JP); Chao Chen, Kariya (JP); Toshihiko Matsuoka, Kariya (JP)

(73) Assignee: DENSO CORPORATION, Kariya (JP)

( * ) Notice: Subject to any disclaimer, the term of this patent is extended or adjusted under 35 U.S.C. 154(b) by 20 days.

(21) Appl. No.: 16/074,177

(22) PCT Filed: Nov. 15, 2016

(86) PCT No.: PCT/JP2016/083805
§ 371 (c)(1),
(2) Date: Jul. 31, 2018

(87) PCT Pub. No.: WO2017/134893
PCT Pub. Date: Aug. 10, 2017

(65) Prior Publication Data
US 2019/0296867 A1  Sep. 26, 2019

(30) Foreign Application Priority Data
Feb. 5, 2016 (JP) .................................. 2016-020767

(51) Int. Cl.
*H04L 1/24* (2006.01)
*G01R 13/02* (2006.01)
(Continued)

(52) U.S. Cl.
CPC .............. *H04L 1/242* (2013.01); *G01R 13/02* (2013.01); *G01R 31/31711* (2013.01);
(Continued)

(58) Field of Classification Search
CPC . H04L 1/242; H04L 25/02; H04L 5/14; H04L 1/20; H04W 56/0045; H03H 7/463;
(Continued)

(56) References Cited

U.S. PATENT DOCUMENTS

| | | | | |
|---|---|---|---|---|
| 2014/0379949 A1* | 12/2014 | Inazu | .................... | G06F 13/362 710/110 |
| 2016/0065221 A1* | 3/2016 | Cheren | .................... | G06F 1/10 327/156 |

FOREIGN PATENT DOCUMENTS

EP  1 460 793 A1  9/2004

OTHER PUBLICATIONS http://opencores.org/websvn,filedetails?repname=1000base-x&path=/1000base-x/trunk/doc/802.3-2008_section3.pdf, "Part 3: Carrier Sense Multiple Access with Collision Detection (CSMA/CD) access method and Physical Layer specifications", Jun. 22, 2010, pp. 1-315, Revision of IEEE Std 802.3.

* cited by examiner

*Primary Examiner* — Jackie Zuniga Abad
(74) *Attorney, Agent, or Firm* — Posz Law Group, PLC

(57) ABSTRACT

A waveform observation system includes two communication nodes, a waveform observation apparatus, and a signal generation portion. The two communication nodes execute a full-duplex communication by a differential signal through a transmission line. The waveform observation apparatus observes a communication signal waveform in the transmission line in response to an input of a trigger signal. The signal generation portion outputs the trigger signal. One of the two communication nodes generates a clock signal, and transmits a signal in synchronization with the clock signal. Remaining one of the two communication nodes reproduces the clock signal included in the signal received from the one of the two communication nodes, and transmits a signal in (Continued)

synchronization with the clock signal that is reproduced. The signal generation portion outputs the trigger signal when equal to or more than two symbols indicated by the signal output to the transmission line consecutively coincide with one another.

13 Claims, 12 Drawing Sheets

(51) Int. Cl.
*G01R 31/317* (2006.01)
*G01R 31/3193* (2006.01)
*H03H 7/46* (2006.01)
*H04L 1/20* (2006.01)
*H04L 5/14* (2006.01)
*H04W 56/00* (2009.01)
*H04L 25/02* (2006.01)

(52) U.S. Cl.
CPC ....... *G01R 31/31937* (2013.01); *H03H 7/463* (2013.01); *H04L 1/20* (2013.01); *H04L 5/14* (2013.01); *H04L 25/02* (2013.01); *H04W 56/0045* (2013.01)

(58) Field of Classification Search
CPC ........ G01R 31/31937; G01R 31/31711; G01R 13/02
See application file for complete search history.

WAVEFORM OBSERVATION SYSTEM AND METHOD FOR WAVEFORM OBSERVATION

CROSS REFERENCE TO RELATED APPLICATION

This application is a U.S. national stage application of International Application No. PCT/JP2016/083805 filed on Nov. 15, 2016 and is based on Japanese Patent Application No. 2016-020767 filed on Feb. 5, 2016, the disclosure of which is incorporated herein by reference.

TECHNICAL FIELD

The present disclosure relates to a system and a method, each of which observes a waveform of a communication signal in a transmission line when two communication nodes execute a full-duplex communication by a differential signal through the transmission line.

BACKGROUND

A high speed communication may be executed by a differential signal through a transmission line. In this case, as described in Patent Literature 1, a method for evaluating a quality of a communication signal waveform, which is affected by jitter or the like, includes a method using an eye pattern or an eye diagram.

PATENT LITERATURE

Patent Literature 1: JP 2004-289388 A

SUMMARY

In a transmission line that executes a full-duplex communication, two communication nodes transmit signals at the same time. In this configuration, when a waveform of the signals is observed using an oscilloscope, or the like, the signals are displayed in overlapped manner with each other. Thus, an eye pattern that is defined by the signals transmitted by the communication nodes is extremely hard to be recognized, and a quality of the waveform may be difficult to be evaluated. In addition to the above-described overlap of signals, the transmission of the signals through the cable may cause a waveform distortion. In this case, the waveform actually observed on a display of the oscilloscope may become a waveform of random noise shown in FIG. 15.

One of the communication nodes generates a clock signal, and communicates with another one of the communication nodes in synchronization with the clock signal. The other one of the communication nodes reproduces the clock signal which is included in the received signal, and transmits a signal in synchronization with the reproduced clock signal. In this kind of system, when the one of the communication nodes suspends the transmission of the signal, the other one of the communication nodes is incapable of reproducing the clock signal, and then jitter increases. Thus, the quality of the waveform is difficult to be properly evaluated when the full-duplex communication is executed.

In view of the foregoing difficulties, it is an object of the present disclosure to provide a waveform observation system and a method for waveform observation, each of which can observe a waveform of signal in a transmission line through which a full-duplex communication is executed by differential signals.

According to an aspect of the present disclosure, one of two communication nodes generates a clock signal, and transmits a signal in synchronization with the clock signal. Remaining one of the two communication nodes reproduces the clock signal included in the signal received from the one of the two communication nodes, and transmits a signal in synchronization with the clock signal that is reproduced. Signal generation portion outputs the trigger signal when equal to or more than two symbols indicated by the signal output to the transmission line consecutively coincide with one another.

With the waveform observation system, a change point of the waveform of the signal transmitted by the remaining one of the two communication nodes is arranged within at least two consecutive symbols having the same value and transmitted by the one of the two communication nodes. Thus, the waveform of the signal under the full-duplex communication can be easily observed, and a quality of the waveform can be properly evaluated.

According to another aspect of the present disclosure, the differential signal includes multivalued levels. With this configuration, when the waveform of the signal, which is an observation target, is complicated, the waveform of the signal can be easily observed.

According to another aspect of the present disclosure, the waveform observation system suspends the waveform adjustment when the waveform of communication signal is observed. A waveform of transmission signal is adjusted in order to reduce generation of noise. In this configuration, the waveform includes the multivalued levels and it is difficult to observe the waveform. Thus, the waveform adjustment is suspended when the waveform of communication signal is observed so that the waveform can be easily observed.

BRIEF DESCRIPTION OF DRAWINGS

The above and other objects, features and advantages of the present invention will become more apparent from the following detailed description made with reference to the accompanying drawings. In the drawings.

EMBODIMENTS

First Embodiment

Figure 1:
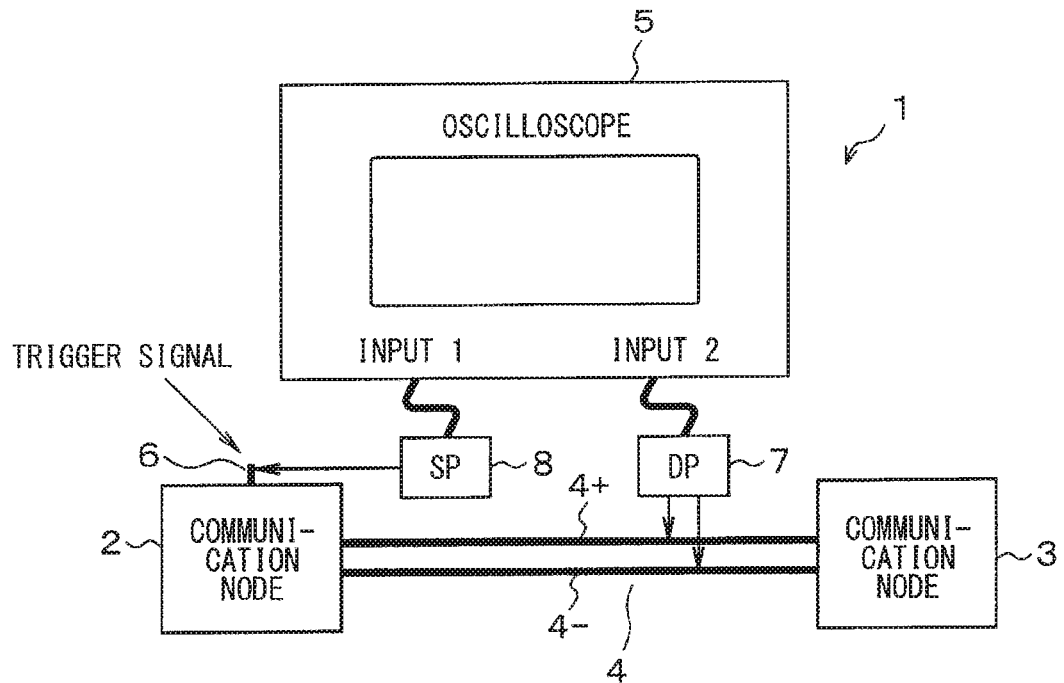
FIG. 1 is a functional block diagram showing a configuration of a waveform observation system according to a first embodiment.

As shown in FIG. 1, a waveform observation system according to a first embodiment includes two communication nodes 2, 3, a transmission line 4, and an oscilloscope 5. The communication node 2 is connected to the communication node 3 through the transmission line 4 that is provided by a differential transmission line. The oscilloscope 5 observes a waveform of a signal in the transmission line 4. The oscilloscope 5 corresponds to a waveform observation apparatus. In the present embodiment, the communication node 2 may function as a master, and the communication node 3 may function as a slave. In this case, each of communication nodes fixes the corresponding function. Alternatively, a communication node that is capable of switching to each of the functions may be employed. In this case, one of communication nodes set to the master and the other one of communication nodes set to the slave are employed. Hereinafter, the communication node 2 is referred to as a master node 2, and the communication node 3 is referred to as a slave node 3.

The master node 2 includes a trigger signal generation portion that will be described below. The trigger signal generation portion outputs a trigger signal from an output terminal 6. The trigger signal is received by the oscilloscope 5. The oscilloscope 5 has a differential probe (DP) 7 and a single probe (SP) 8. The differential probe 7 is connected to signal lines 4+, 4− of the transmission line 4 for observing the waveform of communication signals. The single probe 8 is connected to the output terminal 6 of the master node 2 in order to receive the trigger signal that is employed for observing the waveform. That is, when the master node 2 is provided as an integrated circuit, that is, the IC, the output terminal 6 is different from terminals of the IC connected to the signal lines 4+, 4− of the transmission line 4.

Figure 2:
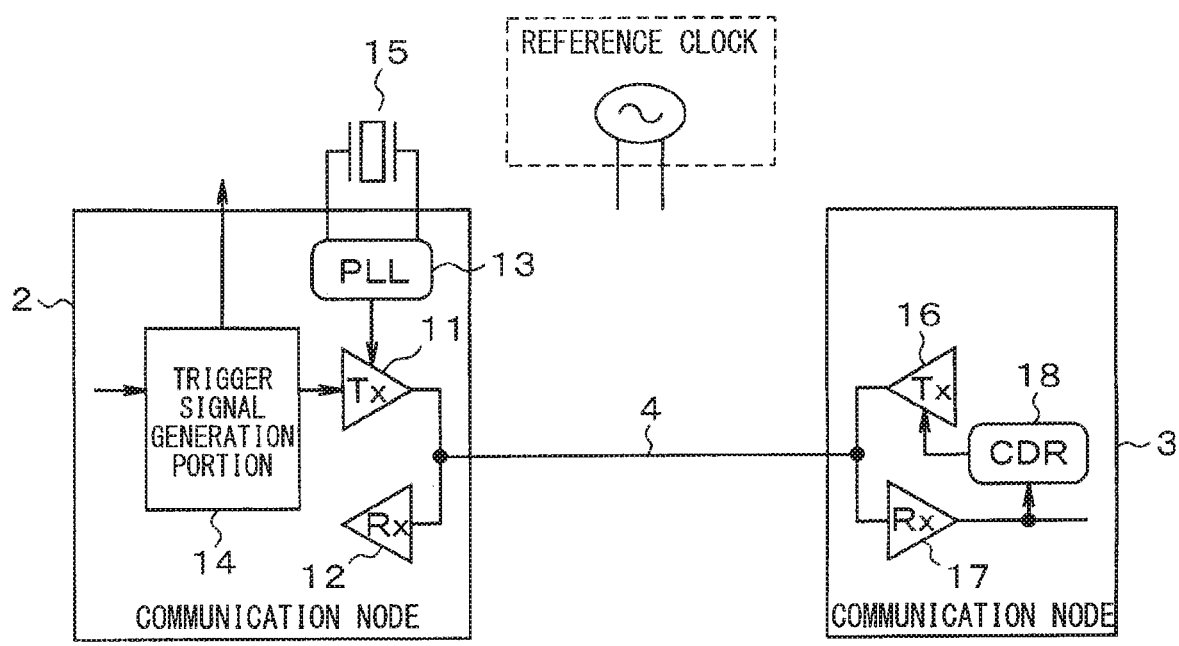
FIG. 2 is a diagram schematically showing configurations of a master node and a slave node.

As shown in FIG. 2, the master node 2 includes a driver circuit 11 for signal transmission, a receiver circuit 12 for signal reception, a PLL (Phase Locked Loop) oscillation circuit 13, and a trigger signal generation portion 14. The PLL oscillation circuit 13 is connected to an oscillator 15 disposed outside of the master node 2. The PLL oscillation circuit 13 generates a clock signal having a predetermined frequency based on a reference clock signal, a differential reference clock, or a single-ended reference clock. The reference clock signal is generated based on oscillation of the oscillator 15. Each of the differential reference clock and a single-ended reference clock is applied from the outside of the master node 2. The PLL oscillation circuit 13 outputs the generated clock signal to the driver circuit 11. The driver circuit 11 transmits data, which is provided by a differential signal, in synchronization with the clock signal received from the PLL oscillation circuit 13. The trigger signal generation portion 14 is provided in a preceding stage of the driver circuit 11 in order to generate the trigger signal received by the oscilloscope 5, as described above.

The slave node 3 includes a drive circuit 16 for signal transmission, a receive circuit 17 for a signal reception, and a CDR (Clock Data Recovery) circuit 18. The CDR circuit 18 reproduces the clock signal included in the transmission signal or the transmission data, which is received from the master node 2 through the transmission line 4 by the receive circuit 17. The CDR circuit 18 outputs the reproduced clock signal to the drive circuit 16. The drive circuit 16 transmits data, which is provided by a differential signal, in synchronization with the clock signal.

Figure 3:
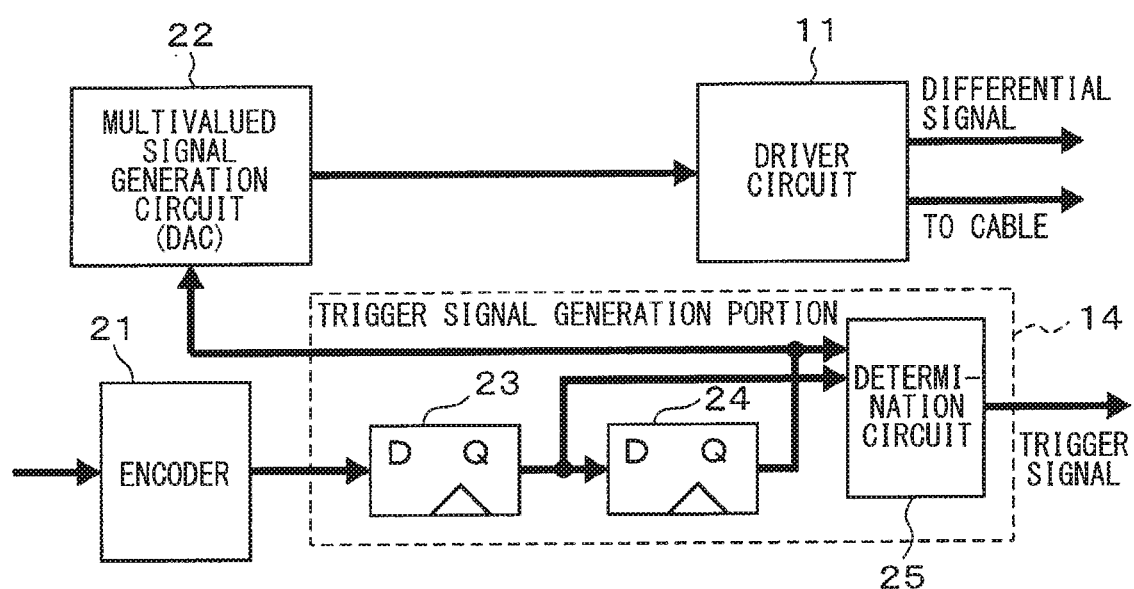
FIG. 3 is a functional block diagram schematically showing a periphery area of a trigger signal generation portion.

As shown in FIG. 3, in the master node 2, the trigger signal generation portion 14 is arranged between an encoder 21 and a multivalued signal generation circuit 22. The encoder 21 and the multivalued signal generation circuit 22 are included in a signal transmission group. The encoder 21 encodes transmission data received from a transmission data generation portion, which is not shown in figures, into three levels of +1, 0, or −1. The trigger signal generation portion 14 receives the encoded transmission data from the encoder 21. The trigger signal generation portion 14 includes two D flip-flops 23, 24 and a determination circuit 25. The D flip-flop 23 is connected to the D flip-flop 24 in series. The D flip-flops 23, 24 are capable of processing the data of the three levels of +1, 0, and −1. The clock signal output from the PLL oscillation circuit 13 is provided to a clock terminal of each of the D flip-flops 23, 24.

The determination circuit 25 is provided by a magnitude comparator. The determination circuit 25 compares data values output from the output terminals Q of the D flip-flops 23, 24. When the data values coincide with one another, the determination circuit 25 outputs a trigger signal. The output terminal Q of the D flip-flop 24 is connected to an input terminal of the multivalued signal generation circuit 22. The multivalued signal generation circuit 22 is provided by a digital to analog converter (DAC). The multivalued signal generation circuit 22 outputs an analog signal corresponding to the input data value having one of three levels to the driver circuit 11. The driver circuit 11 drives the transmission line 4 in order to output the differential signal corresponding to the level of the analog signal received by the driver circuit 11.

Figure 4:
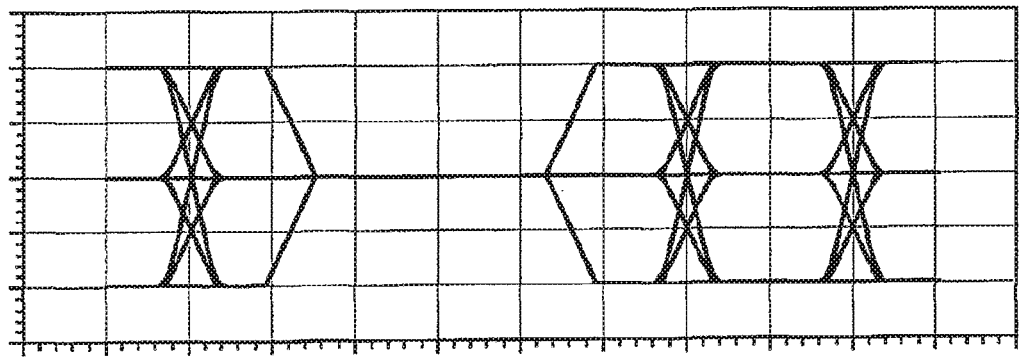
FIG. 4 is a diagram showing a model of a waveform of differential signals observed on a display of an oscilloscope when signal levels for corresponding two symbols are (0, 0)
Figure 5:
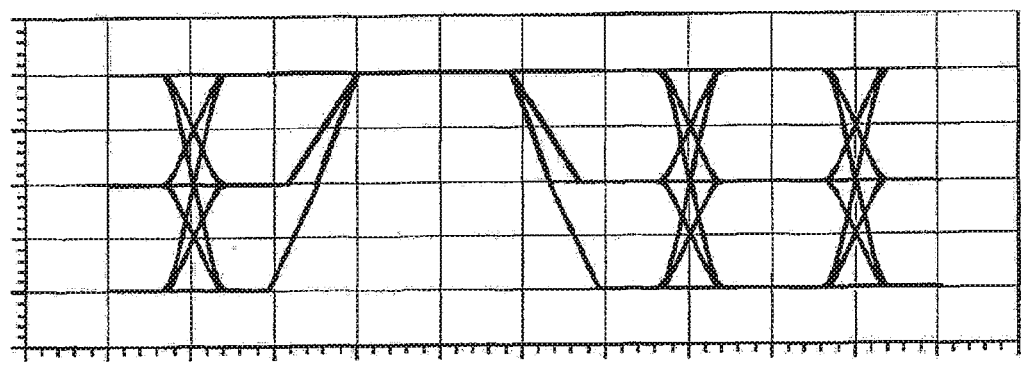
FIG. 5 is a diagram showing a model of a waveform of differential signals observed on the display of the oscilloscope when signal levels for corresponding two symbols are (+1, +1)
Figure 6:
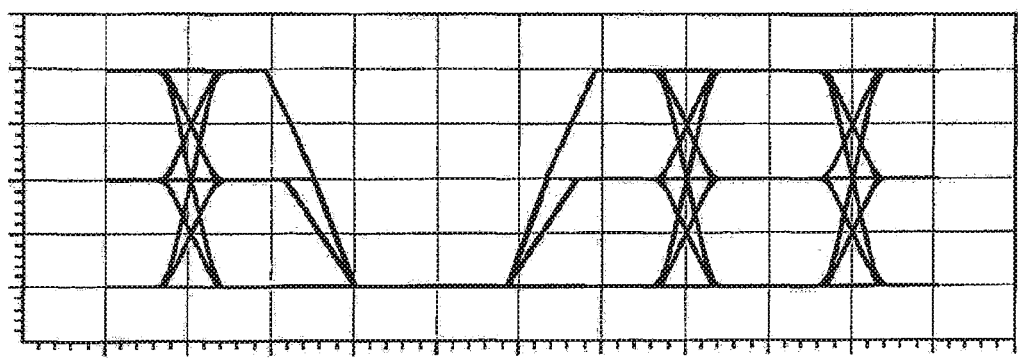
FIG. 6 is a diagram showing a model of a waveform of differential signals observed on the display of the oscilloscope when signal levels for corresponding two symbols are (−1, −1)
Figure 7:
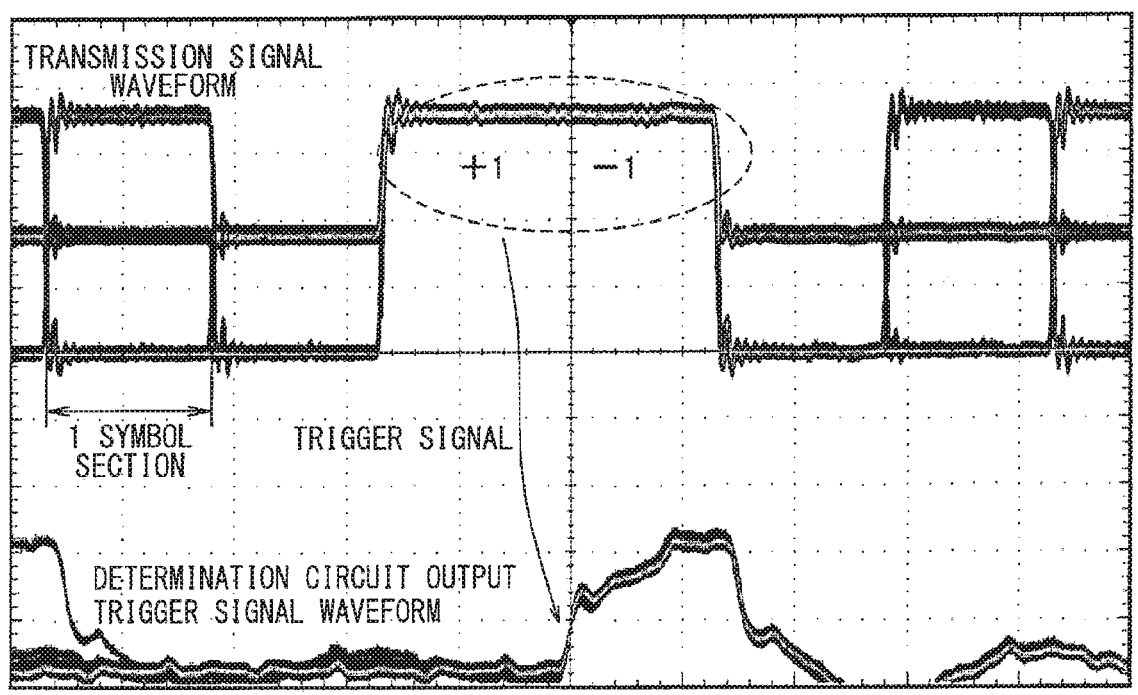
FIG. 7 is a diagram showing a waveform of signals, which corresponds to FIG. 5, actually observed on the display of the oscilloscope.

An operation of the present embodiment will be described. Each of FIG. 4 to FIG. 6 shows a corresponding waveform model of the differential signal observed on a display of the oscilloscope 5 when the master node 2 transmits signal levels in two symbols, which is data values having levels of (0, 0), (+1, +1), or (−1, −1), respectively. FIG. 7 shows, in the case of the signal levels of (+1, +1) shown in FIG. 5, a waveform of the transmission differential signal and a waveform of the trigger signal, each of which is actually observed on the display of the oscilloscope 5.

A transmission symbol rate of the master node 2 is same as a transmission symbol rate of the slave node 3. Thus, when the master node 2 transmits the two symbols having the same level, a change point of the symbol transmitted by the slave node 3 is arranged within the two symbols transmitted by the master node 2. A position of the change point changes based on a remainder obtained by dividing a cable length of the transmission line 4 by a period of one symbol.

The waveform of the trigger signal is raised at an area close to a center of the two symbols that has the same levels.

Figure 8:
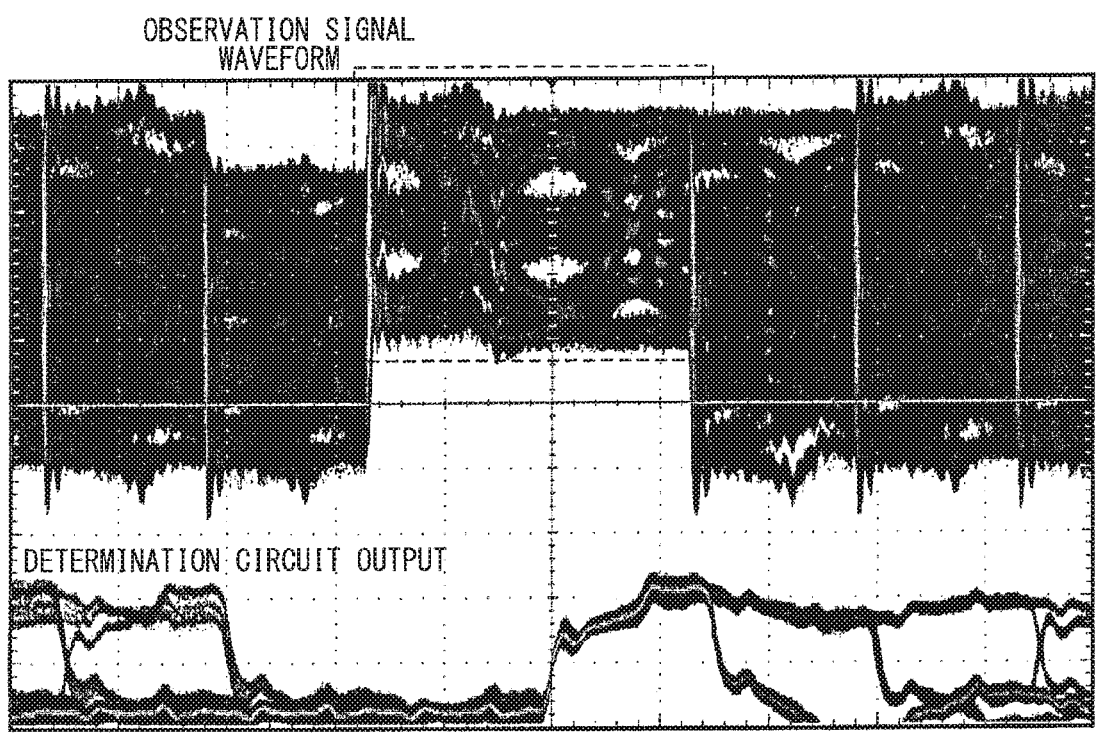
FIG. 8 is a diagram showing a waveform of signals in a full-duplex communication, which corresponds to FIG. 5, actually observed on the display of the oscilloscope.

FIG. 8 shows a waveform of the differential signal and a waveform of the trigger signal, each of which is actually observed on the display of the oscilloscope 5. The waveforms are obtained by combining the waveforms transmitted by the master node 2 with the waveforms transmitted by the slave node 3, that is, by executing a full-duplex communication. Compared with FIG. 15, the configuration can trigger the waveform on the display of the oscilloscope 5 when the eye patterns can be observed clearly.

According to the present embodiment, the PLL oscillation circuit 13 generates the clock signal, and the communication node 2 transmits the signal in synchronization with the generated clock signal. The CDR circuit 18 reproduces the clock signal that is included in the received signal, and the communication node 3 transmits the signal in synchronization with the reproduced clock signal. In the transmission line 4 through which the full-duplex communication is executed between the communication nodes 2, 3, the waveform of the communication signal is observed by the oscilloscope 5. In this configuration, the trigger signal generation portion 14 outputs the trigger signal to the oscilloscope 5 when the two consecutive symbols that are represented by the signals output from the transmission line 4 coincide with one another.

With the above-described configuration, the change point of the waveform of the signal transmitted by the communication node 3 is arranged within the two consecutive symbols having the same value and transmitted by the communication node 2. Thus, the waveform of the signal under the full-duplex communication can be easily observed, and a quality of the waveform can be properly evaluated. The differential signal, which is communicated between the communication nodes 2, 3, has multivalued levels, that is, three levels. With this configuration, when the waveform of the signal, which is an observation target, is complicated, the waveform of the signal can be easily observed.

The trigger signal generation portion 14 is included in the master node 2 that generates the clock signal and outputs the generated clock signal to the transmission line 4. With this configuration, the trigger signal can be generated based on a time point of the clock signal with a high precision.

Second Embodiment

In each embodiment, same portions of the first embodiment are denoted by the same reference symbols and their repetitive description might be omitted. Different portions from the first embodiment will be described. In the second embodiment, a master node is capable of implementing pulse shaping function. The pulse shaping function is a technique in which the master node intentionally processes a waveform to be blunt for noise reduction. The pulse shaping function is employed in communication regulation IEEE P802.3ab, which is described below.

http://grouper.ieee.org/groups/802/3/ab/public/index.html

Figure 9:
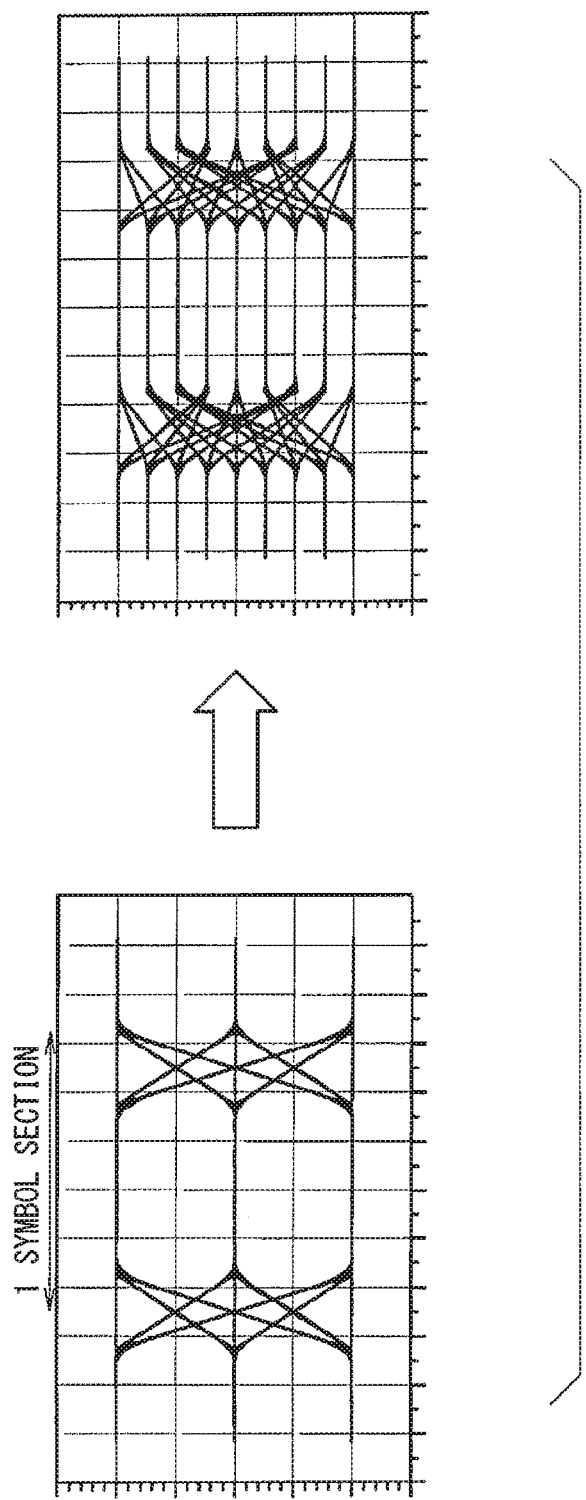
FIG. 9 is a first diagram showing a pulse shaping function according to a second embodiment.

As described on page 212 of the following document, a coefficient employed in a digital filter is defined as $0.75+0.25z^{\wedge}(-1)$.

http://opencores.org/websvn,
filedetails?repname=1000base-x&path=/1000base-x/trunk/doc/802.3-2008_section3.pdf As shown in FIG. 9, with this digital filter, a waveform of a signal having three levels is divided into a waveform of a signal having nine levels. Thus, the waveform becomes further complicated.

Figure 10:
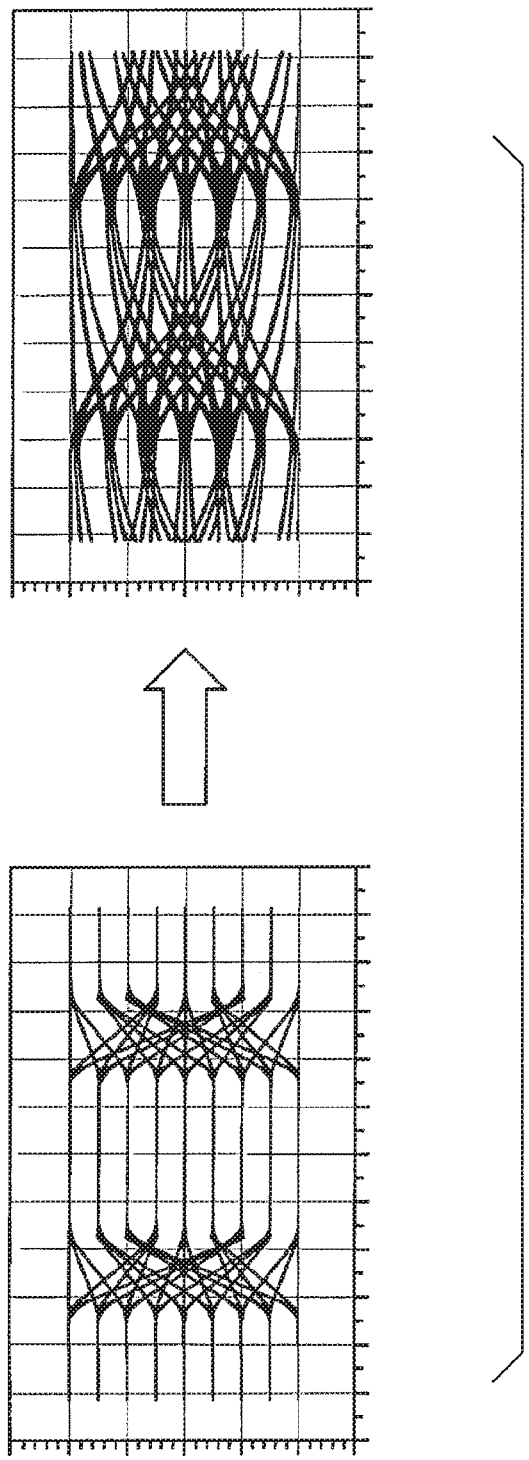
FIG. 10 is a second diagram showing the pulse shaping function.
Figure 11:
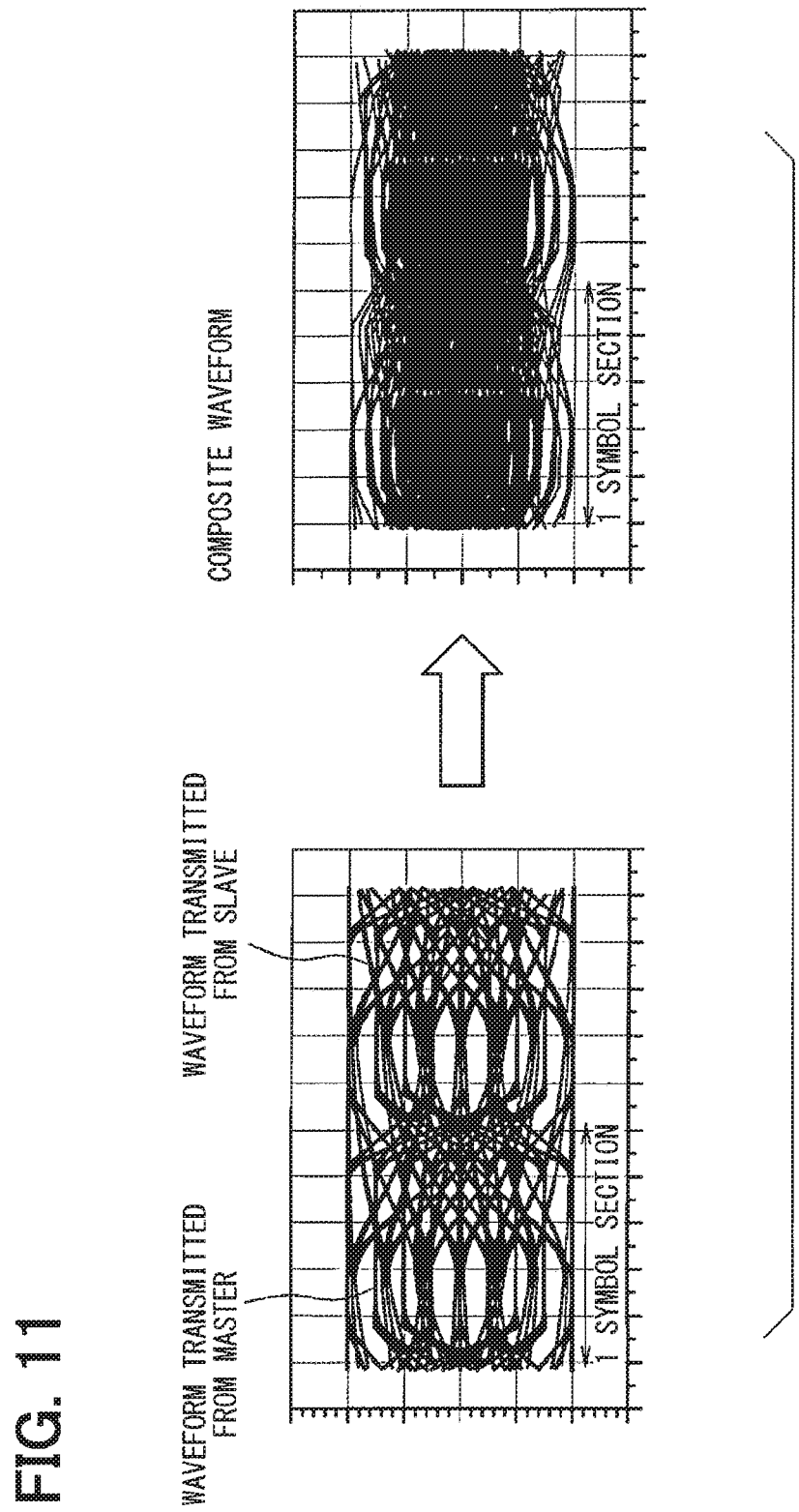
FIG. 11 is a third diagram showing the pulse shaping function.
Figure 15:
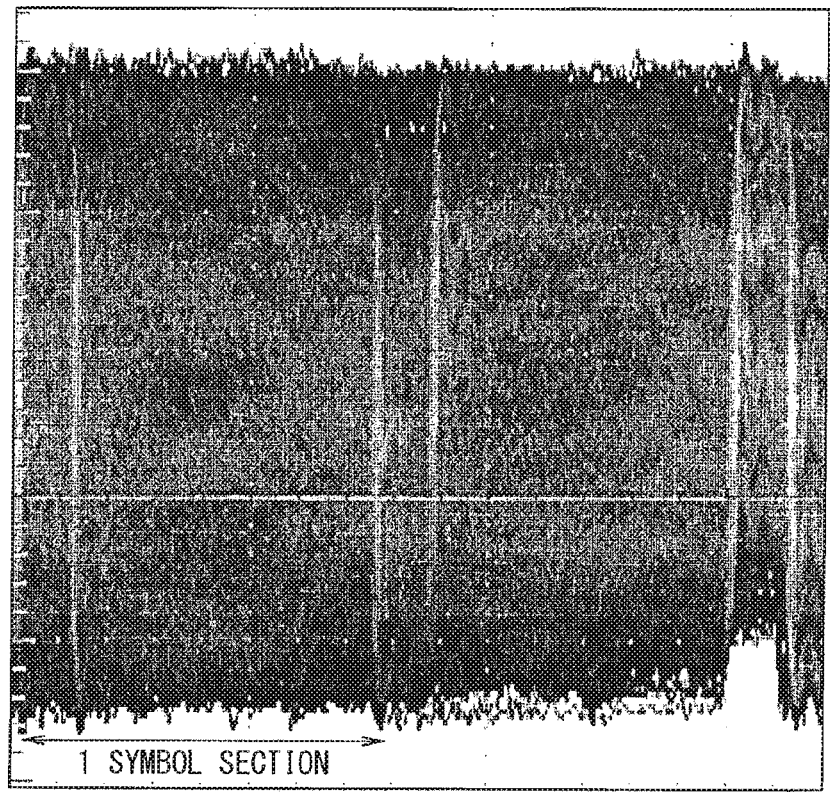
FIG. 15 is a diagram showing a waveform of signals in a full-duplex communication, which employs a related art, observed on the display of the oscilloscope.

When the signal is transmitted to a slave node through the cable, high frequency component of the signal is attenuated as a waveform distortion. FIG. 10 shows the signal waveform to which the waveform distortion is added. FIG. 11 shows a synthesized waveform obtained by adding a transmission signal of the slave node to the transmission signal of the master node. In this configuration, FIG. 15 shows the waveform actually observed by an oscilloscope.

Figure 12:
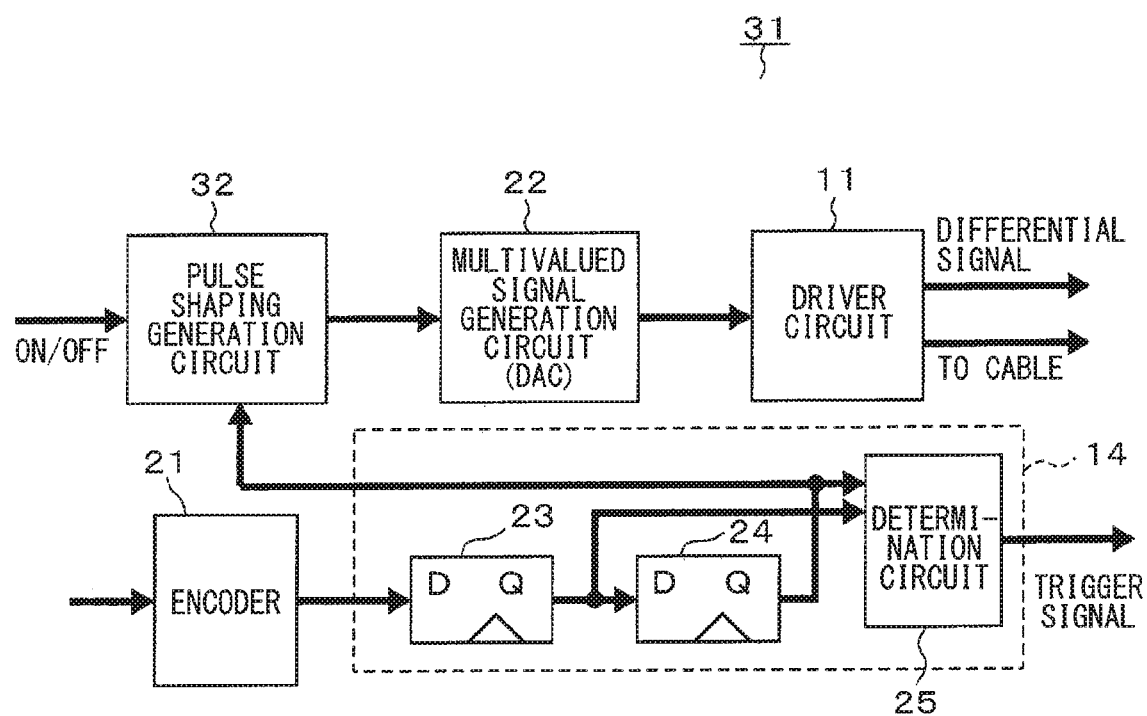
FIG. 12 is a functional block diagram schematically showing a periphery area of a trigger signal generation portion.

As shown in FIG. 12, in a master node 31 according to the second embodiment, a pulse shaping generation circuit 32 is arranged between an output terminal Q of the D flip-flop 24 and an input terminal of the multivalued signal generation circuit 22. A filter function of the pulse shaping generation circuit 32 is capable of being deactivated in response to a control signal transmitted from the outside. That is, when the coefficient of $1+0xz^{\wedge}(-1)$ is employed instead of $0.75+0.25z^{\wedge}(-1)$, the pulse shaping function can be turned off. The pulse shaping function corresponds to a waveform adjustment function.

Figure 13:
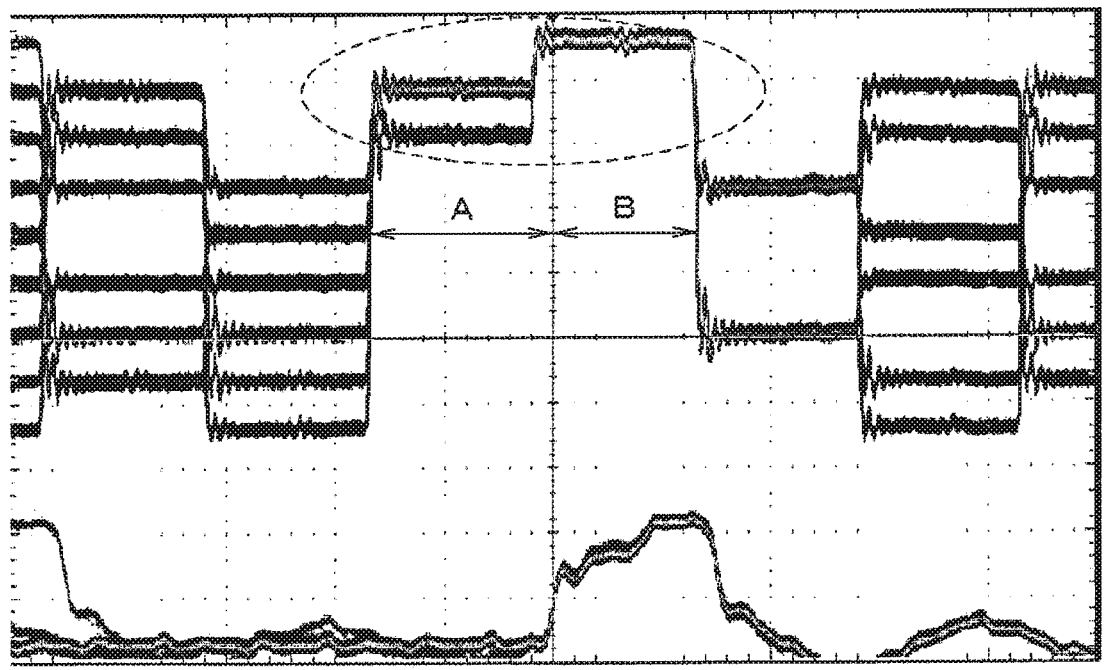
FIG. 13 is a diagram showing a waveform of signals, which corresponds to FIG. 5, actually observed on the display of the oscilloscope when the pulse shaping function is activated.

The pulse shaping function may be executed in the case of the signal levels of (+1, +1) shown in FIG. 7. In this case, as shown in FIG. 13, the signal level in a section A is divided in two levels. Thus, three levels exist when a signal level in a section B is included. The position of the eye pattern in the section A, B depends on the symbol rate and the cable length. Thus, the pulse shaping function is not adequate for evaluating a quality of the waveform.

Figure 14:
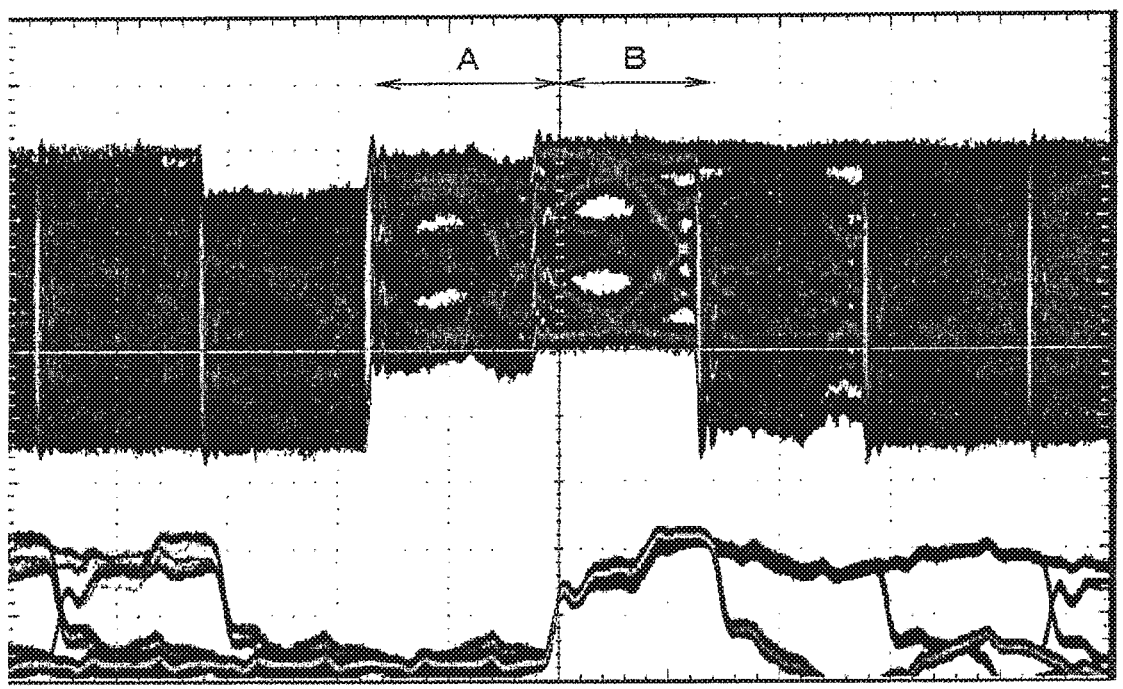
FIG. 14 is a diagram showing a waveform of signals in a full-duplex communication, which corresponds to FIG. 13, actually observed on the display of the oscilloscope.

In the second embodiment, when the waveform of the communication signal is observed by the oscilloscope 5, the pulse shaping function is turned off in response to an instruction to the master node 31 input from the outside. In this case, as shown by the waveform that is actually observed in FIG. 14, the configuration can trigger the waveform on the display of the oscilloscope 5 when the eye patterns can be observed clearly.

As described above, in the second embodiment, when the waveform of the communication signal is observed by the oscilloscope 5, the pulse shaping function that is included in the master node 31 can be suspended. With this configuration, the waveform can be easily observed.

Other Embodiment

The differential signal may be transmitted by a waveform having a multivalued signal of equal to or more than four levels. Alternatively, the differential signal may be transmitted by a waveform having two levels of 1 or 0.

The trigger signal generation portion may be arranged, but is not limited to, in the communication node. Alternatively, the trigger signal generation portion may be arranged outside the communication node.

While the disclosure has been described with reference to preferred embodiments thereof, it is to be understood that the disclosure is not limited to the preferred embodiments and constructions. The disclosure is intended to cover various modification and equivalent arrangements. In addition, the various combinations and configurations, which are preferred, other combinations and configurations, including more, less or only a single element, are also within the spirit and scope of the disclosure.

The invention claimed is:

1. A waveform observation system comprising:
   two communication nodes configured to execute a full-duplex communication by a differential signal through a transmission line;
   a waveform observation apparatus configured to observe a waveform of communication signal in the transmission line in response to an input of a trigger signal; and
   a signal generation portion configured to output the trigger signal,
   wherein
   one of the two communication nodes generates a clock signal, and transmits a first signal in synchronization with the clock signal,
   remaining one of the two communication nodes reproduces the clock signal included in the first signal received from the one of the two communication nodes, and transmits a second signal in synchronization with the clock signal that is reproduced, and
   the signal generation portion outputs the trigger signal when levels of the first signal or the second signal to be transmitted to the transmission line consecutively coincide for at least two symbol sections.

2. The waveform observation system according to claim 1, wherein
   the differential signal includes multivalued levels.

3. The waveform observation system according to claim 1, wherein
   the one of the two communication nodes adjusts, as a waveform adjustment, a waveform of transmission signal in order to reduce generation of noise, and
   the waveform observation system suspends the waveform adjustment when the waveform of communication signal is observed.

4. The waveform observation system according to claim 1, wherein
   the one of the two communication nodes or the remaining one of the two communication nodes includes the signal generation portion.

5. The waveform observation system according to claim 4, wherein
   the one of the two communication nodes is provided as a master node,
   the remaining one of the two communication nodes is provided as a slave node,
   the master node generates the clock signal,
   the slave node reproduces the clock signal, and
   the master node includes the signal generation portion.

6. The waveform observation system according to claim 4, wherein
   the one of the two communication nodes is provided as an integrated circuit,
   the integrated circuit includes a terminal that outputs the trigger signal to an outside of the integrated circuit, and
   the terminal is different from a terminal that is connected to the transmission line.

7. The waveform observation system according to claim 1, wherein
   transmission symbol rates of the two communication nodes are the same.

8. The waveform observation system according to claim 1, further comprising:
   an encoder connected to the signal generation portion in a preceding stage of the signal generation portion, and configured to encode the first signal or the second signal to be transmitted to the transmission line into at least two levels of the first signal or the second signal.

9. A method for waveform observation of a waveform observation system, wherein
   the waveform observation system includes two communication nodes and a waveform observation apparatus,
   one of the two communication nodes generates a clock signal, and transmits a first signal in synchronization with the clock signal,
   remaining one of the two communication nodes reproduces the clock signal included in the first signal received from the one of the two communication nodes, and transmits a second signal in synchronization with the clock signal that is reproduced,
   the two communication nodes execute a full-duplex communication by a differential signal through a transmission line, and
   a waveform of communication signal is observed by the waveform observation apparatus in response to an input of a trigger signal,
   the method for waveform observation comprising:
   outputting the trigger signal when levels of the first signal or the second signal to be transmitted to the transmission line consecutively coincide for at least two symbol sections.

10. The method for waveform observation according to claim 9, wherein
    the differential signal includes multivalued levels.

11. The method for waveform observation according to claim 9, wherein
    the one of the two communication nodes adjusts, as a waveform adjustment, a waveform of transmission signal in order to reduce generation of noise, and
    the waveform observation system suspends the waveform adjustment when the waveform of communication signal is observed.

12. The method for waveform observation according to claim 9, wherein
    transmission symbol rates of the two communication nodes are the same.

13. The method for waveform observation according to claim 9, further comprising:
    encoding the first signal or the second signal to be transmitted to the transmission line into at least two levels of the first signal or the second signal.

* * * * *